(12) United States Patent
Chung et al.

(10) Patent No.: US 10,861,923 B2
(45) Date of Patent: Dec. 8, 2020

(54) DISPLAY DEVICE AND METHOD OF FABRICATING THE SAME

(71) Applicant: Samsung Display Co., Ltd., Yongin-si (KR)

(72) Inventors: Horyun Chung, Suwon-si (KR); Sejoong Shin, Cheonan-si (KR); Hyojin Kim, Suwon-si (KR); Taehyun Sung, Seoul (KR); Changhan Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 77 days.

(21) Appl. No.: 15/993,311

(22) Filed: May 30, 2018

(65) Prior Publication Data

US 2019/0109181 A1    Apr. 11, 2019

(30) Foreign Application Priority Data

Oct. 10, 2017   (KR) .......................... 10-2017-0129120

(51) Int. Cl.
*H01L 27/32* (2006.01)
*H01L 27/12* (2006.01)
(Continued)

(52) U.S. Cl.
CPC ....... *H01L 27/3276* (2013.01); *G09G 3/3225* (2013.01); *G09G 3/3266* (2013.01);
(Continued)

(58) Field of Classification Search
CPC ......... H01L 22/14; H01L 22/32; H01L 22/26; H01L 27/3276; H01L 27/1218;
(Continued)

(56) References Cited

U.S. PATENT DOCUMENTS 7,796,217 B2   9/2010   Suzuki
8,704,762 B2   4/2014   Anno et al.
(Continued)

FOREIGN PATENT DOCUMENTS

JP        5513262 B2    6/2014
JP    2014-186197 A    10/2014
(Continued)

*Primary Examiner* — David Tung
(74) *Attorney, Agent, or Firm* — Lewis Roca Rothgerber Christie LLP

(57) ABSTRACT

A display device includes a substrate in which a first area, a second area and a bending area between the first and second areas are defined, a plurality of pixels disposed above the substrate in the first area, a plurality of conductive layers extending to and intersecting the bending area, a protective film covering the conductive layers and disposed in the bending area, a first portion of the first area adjacent to the bending area, and a second portion of the second area adjacent to the bending area. The display device further includes a plurality of tag layers disposed in the first and second portions and connected to both ends of the conductive layers, wherein the bending area is interposed between the plurality of tag layers. The tag layers are exposed to an outside of the display device by exposure holes defined in the protective film.

15 Claims, 13 Drawing Sheets

(51) Int. Cl.
| | |
|---|---|
| *H01L 51/00* | (2006.01) |
| *G09G 3/3225* | (2016.01) |
| *G09G 3/3275* | (2016.01) |
| *H01L 51/52* | (2006.01) |
| *H01L 51/56* | (2006.01) |
| *H01L 21/66* | (2006.01) |
| *G09G 3/3266* | (2016.01) |

(52) U.S. Cl.
CPC ........... *G09G 3/3275* (2013.01); *H01L 22/26* (2013.01); *H01L 22/32* (2013.01); *H01L 27/1218* (2013.01); *H01L 27/3248* (2013.01); *H01L 27/3262* (2013.01); *H01L 51/0031* (2013.01); *H01L 51/0097* (2013.01); *H01L 51/5253* (2013.01); *H01L 51/56* (2013.01); *G09G 2300/0426* (2013.01); *G09G 2310/08* (2013.01); *G09G 2380/02* (2013.01); *H01L 22/14* (2013.01); *H01L 27/124* (2013.01); *H01L 2227/323* (2013.01); *H01L 2251/5338* (2013.01)

(58) Field of Classification Search
CPC ............. H01L 27/3248; H01L 27/3262; H01L 27/124; H01L 51/0031; H01L 51/0097; H01L 51/56; H01L 51/5253; H01L 2227/323; H01L 2251/5338; G09G 3/3266; G09G 3/3275; G09G 3/3225; G09G 2310/08; G09G 2300/0426; G09G 2380/02

See application file for complete search history.

(56) References Cited

U.S. PATENT DOCUMENTS

| | | | |
|---|---|---|---|
| 9,324,959 B2 | 4/2016 | Namkung et al. | |
| 9,495,893 B2 | 11/2016 | Park | |
| 9,653,368 B2 | 5/2017 | Kwak et al. | |
| 2015/0287750 A1* | 10/2015 | Youn | H01L 27/124 438/586 |
| 2017/0092708 A1* | 3/2017 | Jeon | H01L 27/3262 |
| 2018/0053455 A1* | 2/2018 | Zhang | H01L 27/3276 |
| 2018/0173277 A1* | 6/2018 | Lee | H01L 27/3276 |

FOREIGN PATENT DOCUMENTS

| | | |
|---|---|---|
| KR | 10-0766662 B1 | 10/2007 |
| KR | 10-2014-0120580 A | 10/2014 |
| KR | 10-2015-0078184 A | 7/2015 |
| KR | 10-2016-0017845 A | 2/2016 |

* cited by examiner

DISPLAY DEVICE AND METHOD OF FABRICATING THE SAME

CROSS-REFERENCE TO RELATED APPLICATION

This application claims priority to and the benefit of Korean Patent Application No. 10-2017-0129120, filed on Oct. 10, 2017, the content of which in its entirety is herein incorporated by reference.

BACKGROUND

1. Field

One or more aspects of example embodiments of the invention relate to a display device and a method of fabricating the same and, more particularly, to a display device including a mechanism for resistance measuring and a method of fabricating the same.

2. Description of the Related Art

Display devices (e.g., a monitor, iPad, a smart phone, and a tablet PC) providing images to users may include display panels displaying images. The display panels may include a liquid crystal display panel, an organic light emitting display panel, an electrowetting display panel, and an electrophoretic display panel.

Recently, display devices having flexible display panels and stretchable display panels have been developed with the technology development of the display devices. The flexible display panels may be foldable or rollable, and the stretchable display panel may be stretchable in at least one direction. These display devices may be modified in predetermined forms or may be modified in various forms by users. The display device including the flexible display panel may further include a protective substrate which is disposed under the flexible display panel to protect a lower portion of the flexible display panel.

SUMMARY

Aspects of embodiments of the invention provide a display device including a conductive layer which is used as a mechanism for resistance measuring and is located in a non-display area, and a method of fabricating the same.

In some aspects of the invention, a display device includes a substrate having a first area, a second area, and a bending area between the first and second areas, a plurality of pixels located above the substrate in the first area, a plurality of conductive layers extending to and intersecting the bending area, a protective film covering the conductive layers and located in the bending area, in a first portion of the first area adjacent to the bending area, and in a second portion of the second area adjacent to the bending area, and a plurality of tag layers respectively located in the first and second portions and connected to both ends of the conductive layers, wherein the bending area is interposed between the plurality of tag layers. The tag layers are exposed to an outside of the display device by exposure holes defined in the protective film.

The conductive layers may include a semiconductor material.

The display device may further include a plurality of contact layers located on both ends of the conductive layers to electrically connect the conductive layers to the tag layers.

The tag layers and the contact layers may include a conductive material.

The display device may further include a first sub-insulating layer located on the substrate, wherein the conductive layers are located on the first sub-insulating layer, a second sub-insulating layer located on the first sub-insulating layer to cover the conductive layers located on the first sub-insulating layer, and an insulating layer located on the second sub-insulating layer. The protective film may be located on the insulating layer in the bending area and in the first and second portions, and the tag layers may be located on the insulating layer. The contact layers may be located on both ends of the conductive layers through holes penetrating the second sub-insulating layer and the insulating layer and are electrically connected to both ends of the conductive layers.

The contact layers may include body portions located on both ends of the conductive layers through the holes so as to be electrically connected to both ends of the conductive layers, and extensions located on the insulating layer and extending from the body portions toward the tag layers so as to be electrically connected to the tag layers.

The tag layers may be spaced from the body portions and may be located on ends of the extensions so as to be electrically connected to the extensions.

The tag layers may be located on the contact layers so as to be electrically connected to the contact layers.

The bending area may extend in a first direction, and the first area, the second area, and the bending area may be arranged in a second direction intersecting the first direction.

The conductive layers may extend in the second direction.

The display device may further include a scan driver located above the substrate in a third portion of the first area which does not overlap the first portion and connected to the pixels through scan lines extending in the first direction, an emission driver located above the substrate in the third portion and connected to the pixels through emission lines extending in the first direction, and a data driver located above the substrate in a fourth portion of the second area which does not overlap the second portion and connected to the pixels through data lines. The data lines may extend in the second direction in the second portion, may extend radially in the bending area and in the first portion, and may extend in the second direction in the third portion. The conductive layers may be located with the data lines interposed therebetween, and the tag layers may be located with the data lines interposed therebetween.

The substrate may have flexibility and the bending area may be bent such that the second area is located under the first area.

The substrate may include a base substrate having flexibility, a protective substrate located under the base substrate and having flexibility, and an adhesive member located between the base substrate and the protective substrate to adhere the base substrate to the protective substrate. A bottom of the base substrate in the bending area may be exposed through an opening defined by removing a portion of the protective substrate overlapping with the bending area.

In some aspects of the invention, a method of fabricating a display device includes preparing a display panel including a base substrate having a first area, a second area and a bending area between the first and second areas, a protective substrate located under the base substrate, an adhesive member adhering the base substrate and the protective substrate, conductive layers located above the base substrate and intersecting the bending area, and a plurality of pixels located above the base substrate in the first area, irradiating a $CO_2$ laser into the protective substrate at a first boundary between the bending area and the first area, and a second boundary between the bending area and the second area to cut portions of the protective substrate at the first boundary and the second boundary, irradiating an ultraviolet laser into the bending area to reduce adhesive strength between the adhesive member and the base substrate in the bending area, measuring a resistance of the conductive layers to which the ultraviolet laser is irradiated in the bending area, stopping the irradiating of the ultraviolet laser when the measured resistance is equal to or less than a reference resistance value, and separating the protective substrate of the bending area from the base substrate.

BRIEF DESCRIPTION OF THE DRAWINGS

The above and other aspects and features of the present invention will become more apparent by reference to the following detailed description when considered in conjunction with the accompanying drawings, in which.

DETAILED DESCRIPTION

Figure 1:
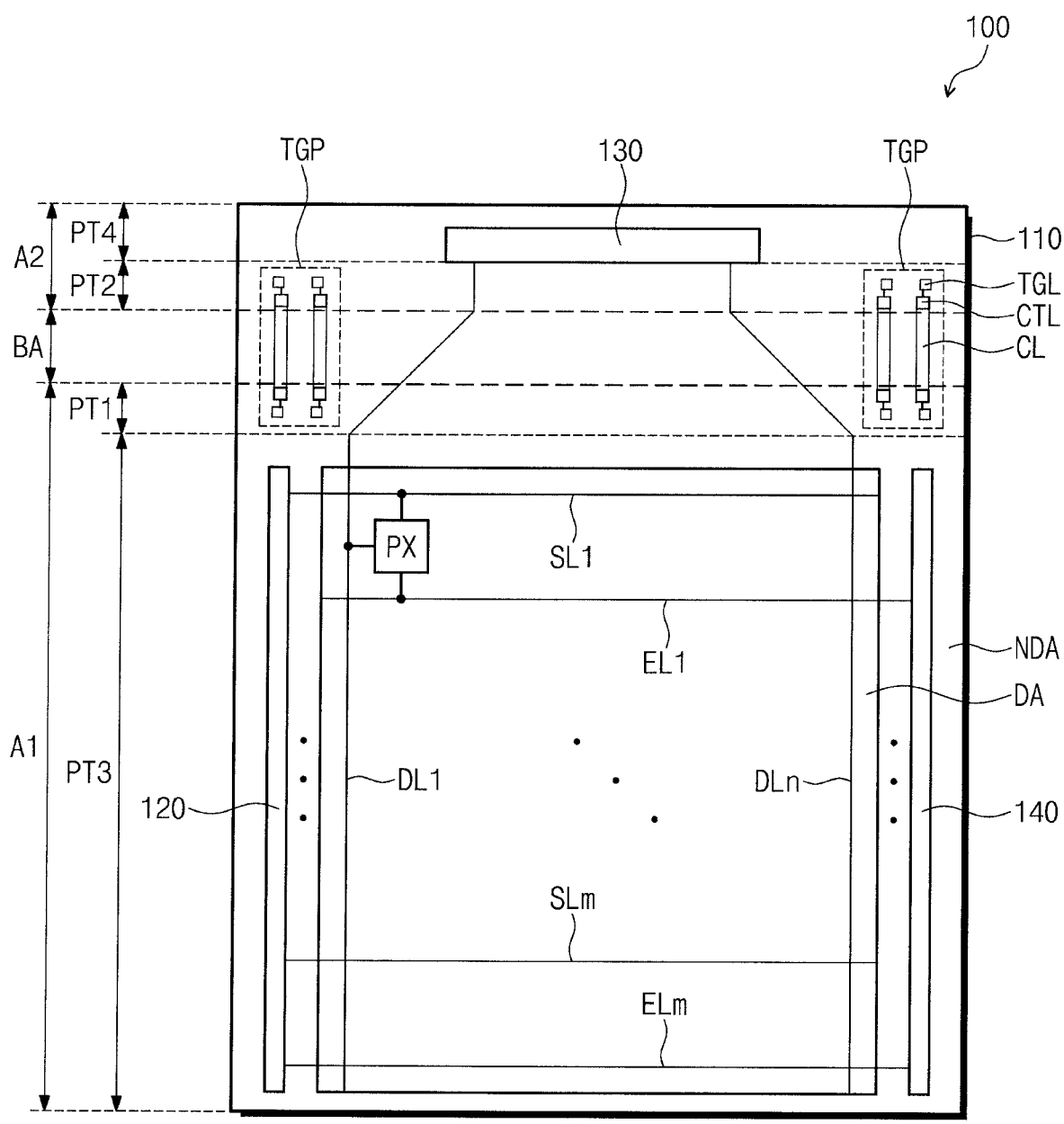
FIG. 1 is a plan view illustrating a display device according to some embodiments of the invention.
Figure 1:
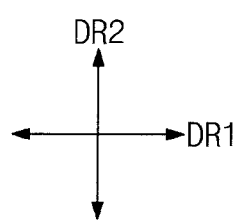

Hereinafter, example embodiments will now be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity and ease of description.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that when an area or element is referred to as being "on," "connected to," or "coupled to" another area or element, it may be directly on, connected, or coupled to the other area or element, or intervening areas or elements may be present therebetween. Conversely, when an area or element is referred to as being "directly on," "directly connected to," or "directly coupled to" another area or element, there are no intervening areas or elements therebetween. In addition, it will also be understood that when an area or element is referred to as being "between" two areas or elements, it can be the only area or element between the two areas or elements, or one or more intervening areas or elements may also be present.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

When a certain embodiment may be implemented differently, a specific process order may be performed differently from the described order. For example, two consecutively described processes may be performed substantially at the same time or performed in an order opposite to the described order.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

As used herein, the terms "substantially," "about," "approximately" and similar terms are used as terms of approximation and not as terms of degree, and are intended to account for the inherent deviations in measured or calculated values that would be recognized by those of ordinary skill in the art. Further, these terms as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
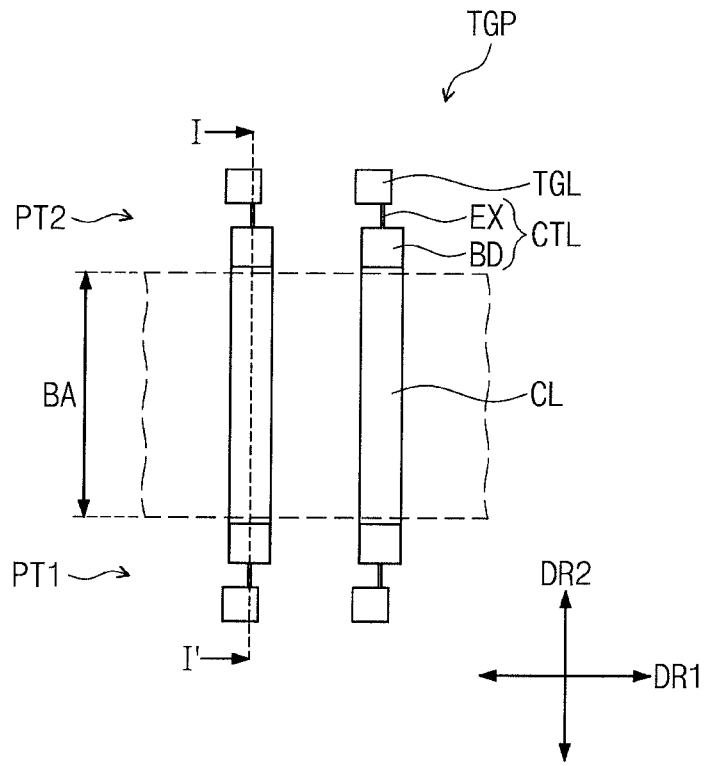
FIG. 2 is an enlarged view of one of the tag portions of FIG. 1.

FIG. 1 is a plan view illustrating a display device according to some embodiments of the invention. FIG. 2 is an enlarged view of one of the tag portions of FIG. 1.

Referring to FIGS. 1 and 2, a display device 100 according to some embodiments of the invention may include a display panel 110, a scan driver 120, a data driver 130, an emission driver 140, and a plurality of tag portions TGP. The display panel 110 may be an organic light emitting display panel. However, embodiments of the invention are not limited thereto or thereby. In some embodiments, the display panel 110 may be one of other various display panels, such as a liquid crystal display panel, an electrowetting display panel, and an electrophoretic display panel.

The display panel 110 may be a flexible display panel. For example, the display panel 110 may include a substrate formed of a plastic material having flexibility and a plurality of electronic elements disposed on or above the substrate. The display panel 110 may have a rectangular shape which has short sides parallel to a first direction DR1 and long sides parallel to a second direction DR2 intersecting the first direction DR1.

The scan driver 120, the data driver 130, and the emission driver 140 may be defined as a driving part for driving the display panel 110. The scan driver 120, the data driver 130, and the emission driver 140 may provide driving signals to the display panel 110 for driving the display panel 110, and the display panel 110 may generate an image in response to the driving signals.

The display panel 110 may have a flat surface (or a plane or planar area) parallel to the first direction DR1 and the second direction DR2. A first area A1, a second area A2, and a bending area BA between the first area A1 and the second area A2 may be defined in the flat surface of the display panel 110. The display panel 110 may include a substrate (illustrated in FIGS. 4 and 5), and the first area A1, the second area A2, and the bending area BA may also be defined in a planar area of the substrate. The bending area BA may extend in the first direction DR1. The first area A1, the bending area BA, and the second area A2 may be arranged in the second direction DR2.

Hereinafter, a portion of the first area A1, which is adjacent to the bending area BA, is defined as a first portion PT1. A portion of the second area A2, which is adjacent to the bending area BA, is defined as a second portion PT2. A remaining portion of the first area A1 except the first portion PT1 (e.g., which does not overlap the first portion PT1) is defined as a third portion PT3. A remaining portion of the second area A2 except the second portion PT2 (e.g., which does not overlap the second portion PT2) is defined as a fourth portion PT4.

The third portion PT3 may include a display area DA and a non-display area NDA surrounding the display area DA. The display area DA may be an area in which an image is displayed, and the non-display area NDA may be an area in which an image is not displayed. The second area A2 and the bending area BA may be areas in which an image is not displayed. The area which does not display an image may be defined as a bezel area.

The display panel 110 may include a plurality of pixels PX, a plurality of scan lines SL1 to SLm, a plurality of data lines DL1 to DLn, and a plurality of emission lines EL1 to ELm. Here, 'm' and 'n' are natural numbers. One pixel PX is illustrated in FIG. 1 for the purpose of ease and convenience of description and illustration. However, the plurality of pixels PX is substantially disposed in the display panel 110. The pixels PX may be arranged in a matrix form in the display area DA and may be connected to the scan lines SL1 to SLm, the data lines DL1 to DLn, and the emission lines EL1 to ELm.

The scan driver 120 and the emission driver 140 may be disposed in the non-display area NDA, and the data driver 130 may be disposed in the fourth portion PT4 of the second area A2. The scan driver 120 may be disposed in the non-display area NDA adjacent to a first side (e.g., one of the long sides) of the display panel 110. The emission driver 140 may be disposed in the non-display area NDA adjacent to another side (e.g., opposite to the first side) of the display panel 110. The data driver 130 may be fabricated in an integrated circuit form and may be mounted in the fourth portion PT4.

The scan lines SL1 to SLm may extend in the first direction DR1 and may be connected to the scan driver 120. The scan lines SL1 to SLm may receive scan signals from the scan driver 120. The data lines DL1 to DLn may be connected to the data driver 130 and may receive data voltages from the data driver 130. The data lines DL1 to DLn may extend in the second direction DR2 in the second portion PT2 and may extend radially (e.g., at an angle with respect to the first and second directions DR1, DR2) in the bending area BA and in the first portion PT1. In addition, the data lines DL1 to DLn may extend in the second direction DR2 in the third portion PT3 so as to be connected to the pixels PX. The emission lines EL1 to ELm may extend in the first direction DR1 and may be connected to the emission driver 140. The emission lines EL1 to ELm may receive emission signals from the emission driver 140.

The scan driver 120 may generate a plurality of scan signals, and the scan signals may be applied to the pixels PX through the scan lines SL1 to SLm. The scan signals may be applied sequentially to the pixels PX. The data driver 130 may generate a plurality of data voltages, and the data voltages may be applied to the pixels PX through the data lines DL1 to DLn. The emission driver 140 may generate a plurality of emission signals, and the emission signals may be applied to the pixels PX through the emission lines EL1 to ELm.

In some embodiments, the display device 100 may include a timing controller to control operations of the scan driver 120, the data driver 130, and the emission driver 140. The timing controller may generate a scan control signal, a data control signal, and an emission control signal in response to control signals received from the outside (e.g., outside of the display device 100). In addition, the timing controller may receive image signals from the outside and may convert a data format of the image signals to adapt the image signals to interface specifications of the data driver 130. The timing controller may provide the image signals, the data format of which is converted, to the data driver 130.

The scan driver 120 may generate the scan signals in response to the scan control signal, and the emission driver 140 may generate the emission signals in response to the emission control signal. The data driver 130 may receive the image signals, the data format of which is converted, and may generate the data voltages corresponding to the image signals in response to the data control signal.

The pixels PX may receive the data voltages in response to the scan signals. The pixels PX may emit light having a brightness corresponding to the data voltages in response to the emission signals, thereby displaying an image. Light emitting times of the pixels PX may be controlled by the emission signals.

The tag portions TGP may be disposed in the bending area BA and the first and second portions PT1 and PT2. The tag portions TGP may extend in the second direction DR2 to intersect the bending area BA. In the region of the first and second portions PT1 and PT2, the data lines DL1 to DLn may be interposed between separate tag portions TGP, such that the tag portions TGP may not overlap with the data lines DL1 to DLn. Two tag portions TGP are illustrated as an example in FIG. 1. However, the number of the tag portions TGP is not limited thereto or thereby.

Referring to FIG. 2, each of the tag portions TGP may include a plurality of conductive layers CL, a plurality of contact layers CTL, and a plurality of tag layers TGL. The conductive layers CL may extend in the second direction DR2 to intersect the bending area BA and may be disposed in the bending area BA and the first and second portions PT1 and PT2. Both ends of each of the conductive layers CL may be respectively disposed in the first and second portions PT1 and PT2, with the bending area BA interposed therebetween. Two conductive layers CL are illustrated as an example in FIG. 2. However, the number of the conductive layers CL is not limited thereto or thereby.

The conductive layers CL may be disposed with the data lines DL1 to DLn interposed therebetween (e.g., between conductive layers CL of separate tag portions TGP), and the tag layers TGL may also be disposed with the data lines DL1 to DLn interposed therebetween, as illustrated in FIG. 1. The contact layers CTL may also be disposed with the data lines DL1 to DLn interposed therebetween.

The tag layers TGL and the contact layers CTL may include a conductive material. The respective tag layers TGL may be disposed adjacent to both ends of each of the conductive layers CL in the first and second portions PT1 and PT2, and may be electrically connected to both ends of each of the conductive layers CL. The contact layers CTL may be disposed on both ends of each of the conductive layers CL in the first and second portions PT1 and PT2, and may electrically connect the conductive layers CL to the respective tag layers TGL.

The contact layers CTL may include body portions BD disposed on both ends of each of the conductive layers CL so as to be electrically connected to the conductive layers CL, and extensions EX extending from the body portions BD. The tag layers TGL may be spaced apart from the body portions BD, and the extensions EX may extend toward the tag layers TGL so as to be electrically connected to the tag layers TGL, respectively. Ends of the extensions EX may overlap with the tag layers TGL. The tag layers TGL may be exposed to the outside (e.g., outside the display device 100). This will be described in more detail below.

The conductive layers CL may include a semiconductor material or a metal material. When laser is irradiated into the conductive layers CL, resistances of the conductive layers CL may be changed depending on an irradiation time of the laser. A function of the conductive layers CL using the change in resistance of the conductive layers CL will be described in more detail with reference to FIGS. 7 to 10.

Figure 10:
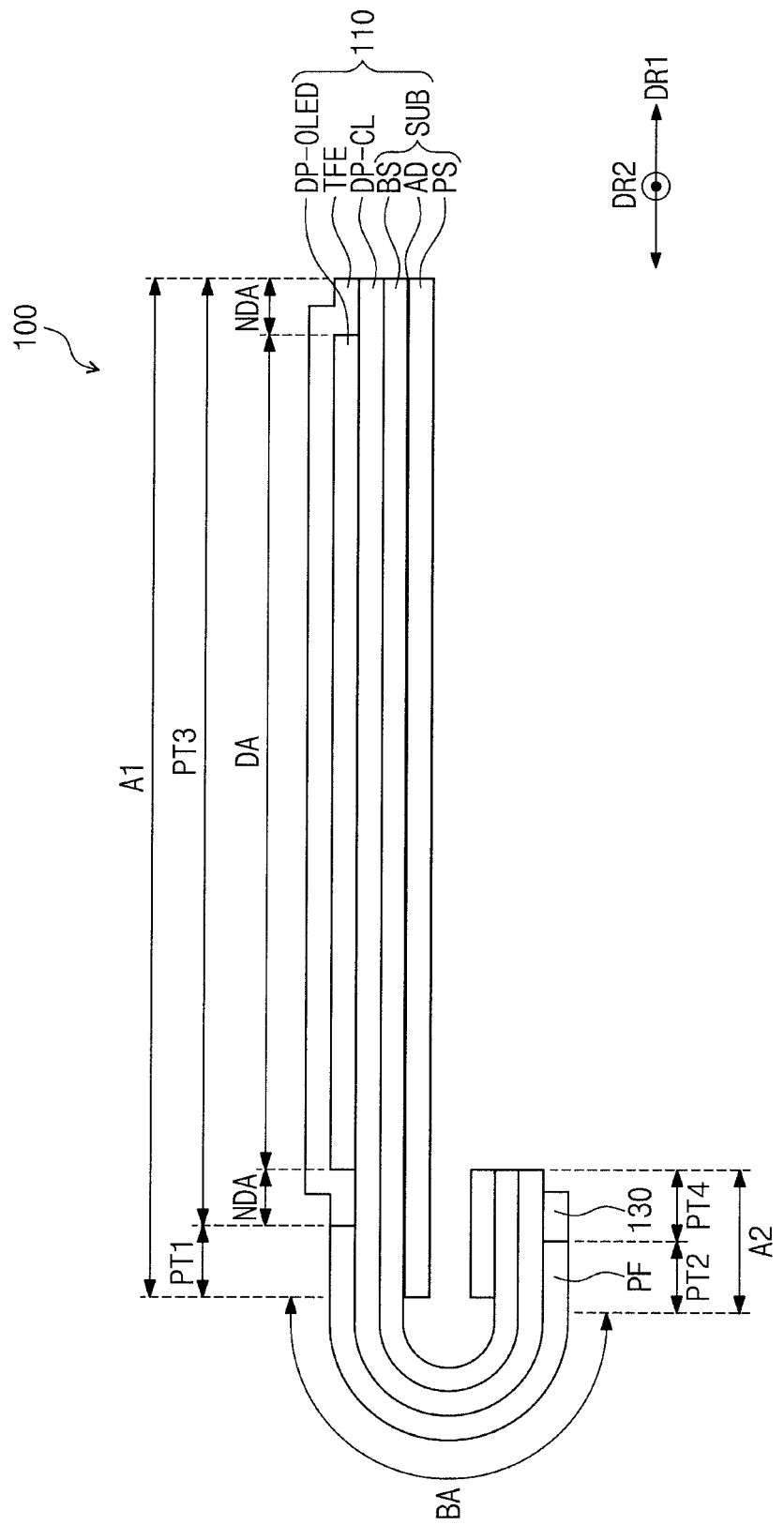

The bending area BA may be bent toward a bottom surface of the display panel 110, and the second area A2 in which the data driver 130 is disposed may be disposed under the first area A1 of the display panel 110 after bending (see FIG. 10).

Figure 3:
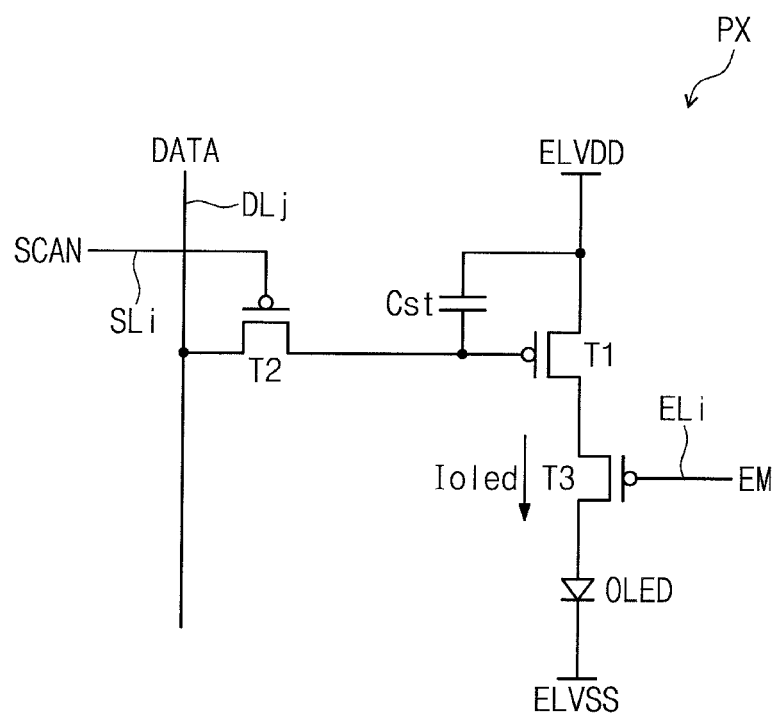
FIG. 3 is an equivalent circuit diagram of a pixel illustrated in FIG. 1.

FIG. 3 is an equivalent circuit diagram of a pixel illustrated in FIG. 1.

One pixel PX is illustrated in FIG. 3. However, the pixels PX disposed in the display panel 110 may have the same or similar structure or configuration as the pixel PX illustrated in FIG. 3.

Referring to FIG. 3, the pixel PX may be connected to a corresponding scan line SLi of the scan lines SL1 to SLm, a corresponding data line DLj of the data lines DL1 to DLn, and a corresponding emission line ELi of the emission lines EL1 to ELm. Here, "i" is a natural number equal to or less than 'm', and 'j' is a natural number equal to or less than 'n'.

The pixel PX may include a light emitting element OLED, a driving transistor T1, a capacitive element Cst, a switching transistor T2, and an emission control transistor T3. The light emitting element OLED may be an organic light emitting diode.

A source terminal of the driving transistor T1 may be provided with a first voltage ELVDD, and a drain terminal of the driving transistor T1 may be connected to a source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitive element Cst may be connected to the source terminal of the driving transistor T1, and a second electrode of the capacitive element Cst may be connected to the gate terminal of the driving transistor T1.

A gate terminal of the emission control transistor T3 may be connected to the emission line ELi, and a drain terminal of the emission control transistor T3 may be connected to an anode electrode of the light emitting element OLED. A cathode electrode of the light emitting element OLED may receive a second voltage ELVSS. A level of the second voltage ELVSS may be lower than a level of the first voltage ELVDD.

The switching transistor T2 may be turned-on in response to a scan signal SCAN provided through the scan line SLi. The turned-on switching transistor T2 may provide a data voltage DATA received through the data line DLj to the gate terminal of the driving transistor T1. The capacitive element Cst may store the data voltage DATA applied to the gate terminal of the driving transistor T1 and may retain the stored data voltage DATA after the switching transistor T2 is turned-off.

The gate terminal of the emission control transistor T3 may receive an emission signal EM through the emission line ELi, and thus the emission control transistor T3 may be turned-on. The turned-on emission control transistor T3 may provide a current Ioled flowing through the driving transistor T1 to the light emitting element OLED. The pixel PX may emit light while the emission signal EM is applied to the emission control transistor T3. An intensity of the light emitted from the light emitting element OLED may be changed depending on the amount of the current Ioled.

Figure 4:
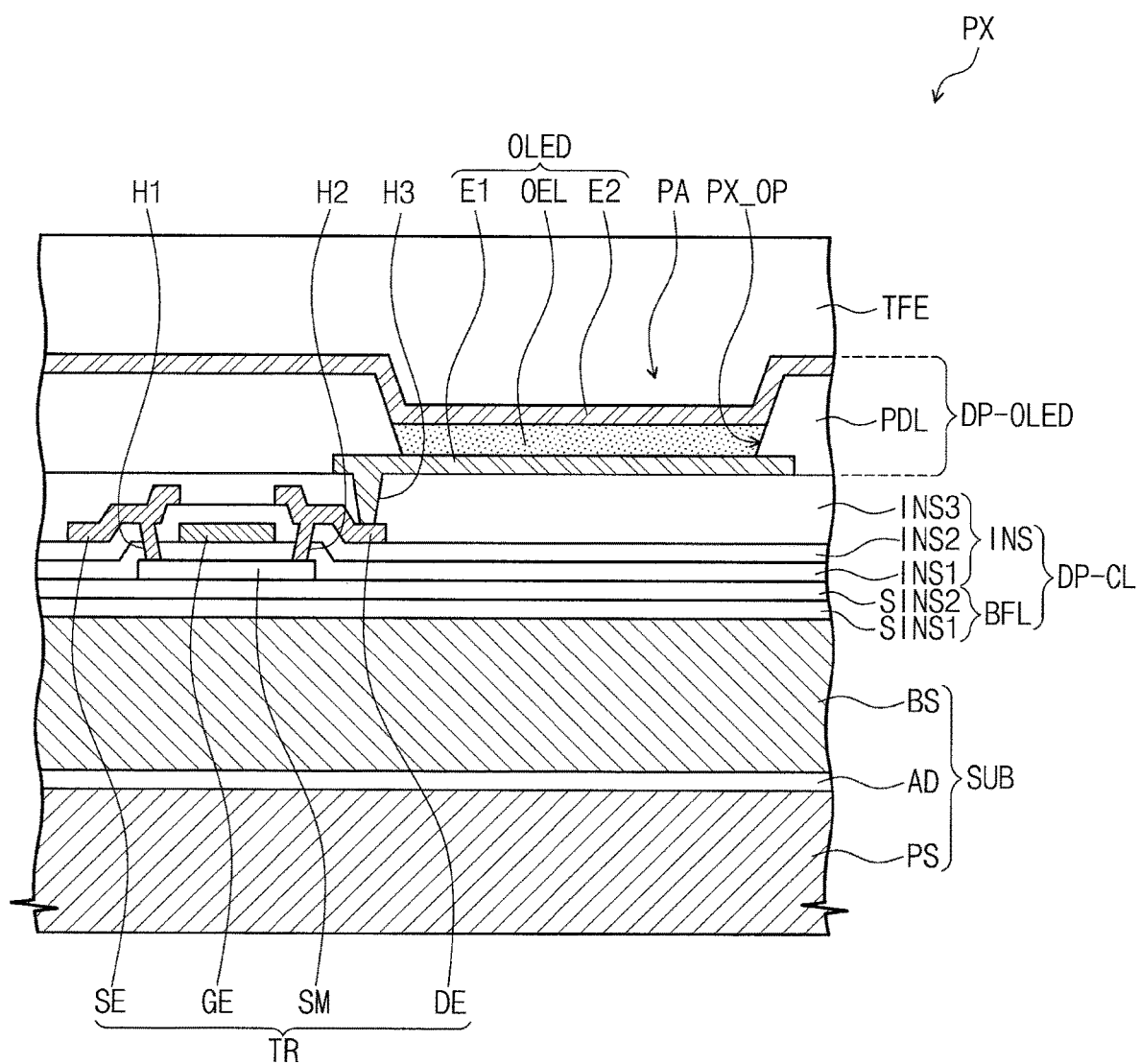
FIG. 4 is a cross-sectional view illustrating the pixel of FIG. 3.

The transistors T1 to T3 of the pixel PX may be PMOS transistors in FIG. 4. However, embodiments of the invention are not limited thereto or thereby. In some embodiments, the transistors T1 to T3 of the pixel PX may be NMOS transistors. The transistors T1 to T3 of the pixel PX may be defined as driving elements.

FIG. 4 is a cross-sectional view illustrating the pixel of FIG. 3.

Referring to FIG. 4, the pixel PX may include a light emitting element OLED and a transistor TR connected to the light emitting element OLED. The transistor TR may be the emission control transistor T3 of FIG. 3. The transistor TR and the light emitting element OLED may be disposed on a substrate SUB, and the substrate SUB may include a transparent flexible substrate formed of a plastic having flexibility.

The substrate SUB may include a base substrate BS, a protective substrate PS disposed under the base substrate BS, and an adhesive member AD disposed between the base substrate BS and the protective substrate PS to adhere the base substrate BS to the protective substrate PS. The protective substrate PS may define the bottom surface of the display panel 110.

The base substrate BS and the protective substrate PS may be transparent flexible substrates. For example, the base substrate BS may be formed of polyimide (PI), and the protective substrate PS may be formed of polyethylene terephthalate (PET). The adhesive member AD may be a silicon-based adhesive.

A buffer layer BFL may be disposed on the substrate SUB, and an insulating layer INS may be disposed on the buffer layer BFL. The buffer layer BFL may include a first sub-insulating layer SINS1 disposed on the substrate SUB, and a second sub-insulating layer SINS2 disposed on the first sub-insulating layer SINS1. Each of the first and second sub-insulating layers SINS1 and SINS2 may be an inorganic insulating layer including an inorganic material. For example, the first sub-insulating layer SINS1 may include a silicon nitride ($SiN_x$) layer, and the second sub-insulating layer SINS2 may include a silicon oxide ($SiO_x$) layer.

The insulating layer INS may include a first insulating layer INS1 disposed on the second sub-insulating layer SINS2 of the buffer layer BFL, a second insulating layer INS2 disposed on the first insulating layer INS1, and a third insulating layer INS3 disposed on the second insulating layer INS2. Each of the first and second insulating layers INS1 and INS2 may be an inorganic insulating layer including an inorganic material, and the third insulating layer INS3 may be an organic insulating layer including an organic material.

A semiconductor layer SM of the transistor TR may be disposed on the buffer layer BFL. The semiconductor layer SM may include an inorganic semiconductor such as amorphous silicon or poly-silicon or may include an organic semiconductor. Alternatively, the semiconductor layer SM may include an oxide semiconductor. In some embodiments, the semiconductor layer SM may include a source region, a drain region, and a channel region between the source region and the drain region.

The first insulating layer INS1 may be disposed on or over the base substrate BS to cover the semiconductor layer SM. A gate electrode GE of the transistor TR may be disposed on the first insulating layer INS1 and may overlap with the semiconductor layer SM. The gate electrode GE may be disposed to overlap with the channel region of the semiconductor layer SM. The second insulating layer INS2 may be disposed on the first insulating layer INS1 to cover the gate electrode GE. The second insulating layer INS2 may be defined as an interlayer insulating layer.

A source electrode SE and a drain electrode DE of the transistor TR may be spaced apart from each other on the second insulating layer INS2. The source electrode SE may be connected to the source region of the semiconductor layer SM through a first contact hole H1 penetrating the first and second insulating layers INS1 and INS2. The drain electrode DE may be connected to the drain region of the semiconductor layer SM through a second contact hole H2 penetrating the first and second insulating layers INS1 and INS2.

The third insulating layer INS3 may be disposed on the second insulating layer INS2 to cover the source electrode SE and the drain electrode DE of the transistor TR. The third insulating layer INS3 may be defined as a planarization layer having a flat top or upper surface.

A first electrode E1 of the light emitting element OLED may be disposed on the third insulating layer INS3. The first electrode E1 may be connected to the drain electrode DE of the transistor TR through a third contact hole H3 penetrating the third insulating layer INS3. The first electrode E1 may be defined as a pixel electrode or an anode electrode. The first electrode E1 may include a transparent electrode or a reflective electrode.

A pixel defining layer PDL exposing a predetermined portion of the first electrode E1 may be disposed on the first electrode E1 and the third insulating layer INS3. A pixel opening PX_OP exposing the predetermined portion of the first electrode E1 may be defined in the pixel defining layer PDL. An area in which the pixel opening PX_OP is disposed may be defined as a pixel area PA.

An organic light emitting layer OEL may be disposed on the first electrode E1 in the pixel opening PX_OP. The organic light emitting layer OEL may include an organic material capable of generating light having one of a red color, a green color, and a blue color. In other words, the organic light emitting layer OEL may generate one of red light, green light, and blue light. However, embodiments of the invention are not limited thereto or thereby. In some embodiments, the organic light emitting layer OEL may generate white light by a combination of organic materials generating red light, green light, and blue light.

The organic light emitting layer OEL may include a low-molecular organic material or a high-molecular organic material. In some embodiments, the organic light emitting layer OEL may be formed of a multi-layer that includes a hole injection layer (HIL), a hole transporting layer (HTL), a light emitting layer, an electron transporting layer (ETL), and an electron injection layer (EIL). The hole injection layer may be disposed on the first electrode E1. The hole transporting layer, the light emitting layer, the electron transporting layer and the electron injection layer may be sequentially stacked on the hole injection layer.

A second electrode E2 of the light emitting element OLED may be disposed on the pixel defining layer PDL and the organic light emitting layer OEL. The second electrode E2 may be defined as a common electrode or a cathode electrode. The second electrode E2 may include a transparent electrode or a reflective electrode. When the display panel 110 is a front emission type organic light emitting display panel, the first electrode E1 may be the reflective electrode and the second electrode E2 may be the transparent electrode. When the display panel 110 is a back emission type organic light emitting display panel, the first electrode E1 may be the transparent electrode and the second electrode E2 may be the reflective electrode.

The light emitting element OLED may be formed in the pixel area PA and may include the first electrode E1, the organic light emitting layer OEL, and the second electrode E2 in the pixel area PA. The first electrode E1 may be an anode corresponding to a hole injection electrode, and the second electrode E2 may be a cathode corresponding to an electron injection electrode. A first power source voltage may be applied to the first electrode E1 and a second power source voltage, a polarity of which is opposite to that of a driving power voltage, may be applied to the second electrode E2. Thus, light may be emitted from the organic light emitting layer OEL of the light emitting element OLED by the transistor TR.

Holes and electrons injected in the organic light emitting layer OEL may be combined with each other to generate excitons, and the excitons may transition from an excited state to a ground state to emit light from the light emitting element OLED. The light emitting element OLED may emit one of the red light, the green light, and the blue light by a flow of a current, to display a piece of image information.

Hereinafter, a layer including the buffer layer BFL, the first to third insulating layers INS1 to INS3, and the transistor TR is defined as a circuit layer DP-CL. One transistor TR is illustrated in FIG. 4. However, the transistors T1 to T3 of the pixel PX may be disposed as the driving elements in the circuit layer DP-CL. A layer including the light emitting element OLED and the pixel defining layer PDL is defined as a light emitting element layer DP-OLED.

A thin film encapsulation layer TFE may be disposed on the second electrode E2. The thin film encapsulation layer TFE may be disposed above the pixel defining layer PDL to cover the pixels PX. The thin film encapsulation layer TFE may have a multi-layered structure and may include inorganic layers and organic layers. The inorganic layers may protect the light emitting element layer DP-OLED from water and oxygen, and the organic layers may protect the light emitting element layer DP-OLED from a foreign material such as dust particles.

Figure 5:
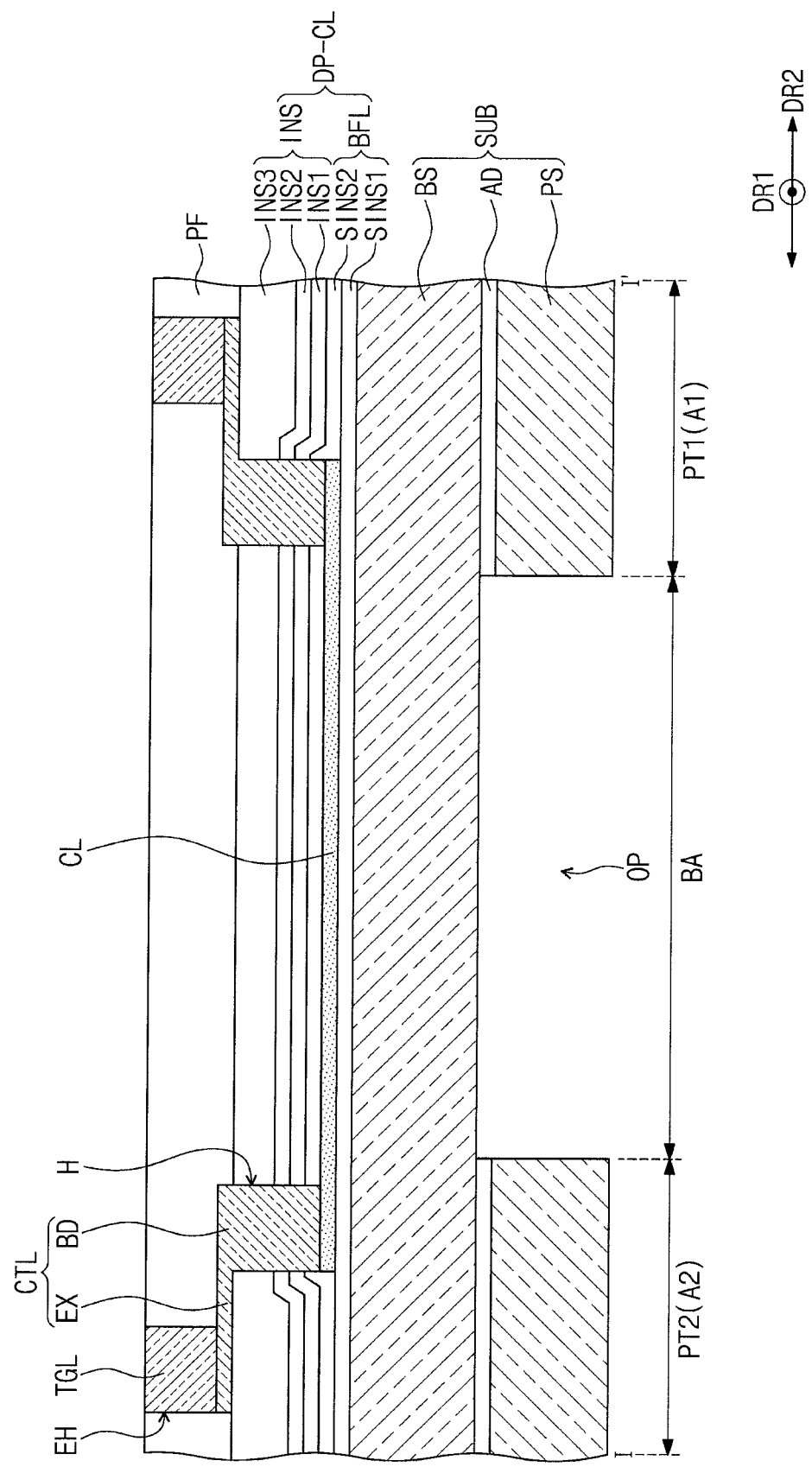
FIG. 5 is a cross-sectional view taken along a line I-I' of FIG. 2.

FIG. 5 is a cross-sectional view taken along a line I-I' of FIG. 2.

Referring to FIG. 5, the conductive layer CL may be disposed on the first sub-insulating layer SINS1, and the second sub-insulating layer SINS2 may be disposed on the first sub-insulating layer SINS1 to cover the conductive layer CL. In the case in which the conductive layer CL includes a semiconductor material, the semiconductor material may include amorphous silicon. When a laser is irradiated into the semiconductor material (such as amorphous silicon), a resistance of the semiconductor material may decrease as an irradiation time of the laser increases.

The contact layers CTL may be disposed on both ends of the conductive layer CL through holes H penetrating the insulating layer INS and the second sub-insulating layer SINS2. The contact layers CTL may be electrically connected to both ends of the conductive layer CL. In addition, the contact layers CTL may extend toward the tag layers TGL in the second direction DR2 on the insulating layer INS (e.g., third insulating layer INS3) and may be electrically connected to the tag layers TGL.

For example, the contact layers CTL may be formed of the same material as the drain and source electrodes DE and SE of the transistor TR. The tag layers TGL may be formed of the same material as the drain and source electrodes DE and SE or the first electrode E1.

Body portions BD of the contact layers CTL may be disposed on both ends of the conductive layer CL through the holes H and may be electrically connected to both ends of the conductive layer CL. The extensions EX of the contact layers CTL may extend from the body portions BD toward the tag layers TGL in the second direction DR2 on the insulating layer INS and may be electrically connected to the tag layers TGL. The tag layers TGL may be exposed to the outside (e.g., outside of the display device 100) through exposure holes EH defined in a protective film PF. The tag layers TGL may be disposed on ends of the extensions EX through the exposure holes EH and may be electrically connected to the ends of the extensions EX.

The protective substrate PS may be disposed under the base substrate BS, and a portion of the protective substrate PS overlapping with the bending area BA may be removed to define an opening OP in the protective substrate PS. In the bending area BA, a bottom of the base substrate BS may be exposed by the opening OP defined in the protective substrate PS.

Figure 6:
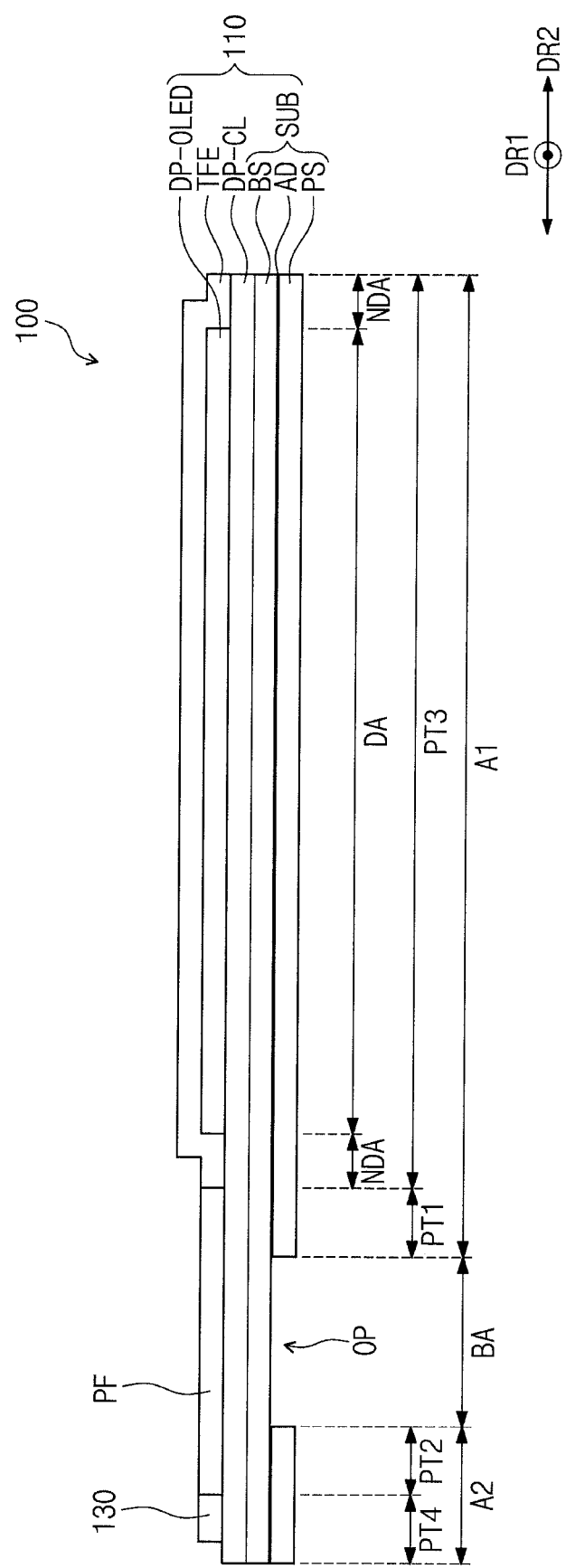
FIG. 6 is a side view illustrating the display device of FIG. 1 when viewed in a first direction.

FIG. 6 is a side view illustrating the display device of FIG. 1 when viewed in a first direction.

Referring to FIG. 6, the protective substrate PS may be disposed under the base substrate BS, and the opening OP may be defined in the protective substrate PS. The circuit layer DP-CL may be disposed on the base substrate BS. The transistors T1, T2, and T3 of the circuit layer DP-CL may be disposed in the display area DA. The buffer layer BFL and the insulating layer INS of the circuit layer DP-CL may be disposed in the first area A1, the second area A2, and the bending area BA. The scan lines SL1 to SLm, the emission lines EU to ELm, the data lines DL1 to DLn and at least portions of the tag portions TGP may be disposed in the circuit layer DP-CL.

The light emitting element layer DP-OLED may be disposed on the circuit layer DP-CL in the display area DA. The thin film encapsulation layer TFE may be disposed above the circuit layer DP-CL in the third portion PT3 and may encapsulate the light emitting element layer DP-OLED. The protective film PF may be disposed on the circuit layer DP-CL in the bending area BA and in the first and second portions PT1 and PT2. The data driver 130 may be disposed on the circuit layer DP-CL in the fourth portion PT4.

FIGS. 7 to 10 are schematic views illustrating a method of fabricating a display device, according to some embodiments of the invention.

Figure 7:
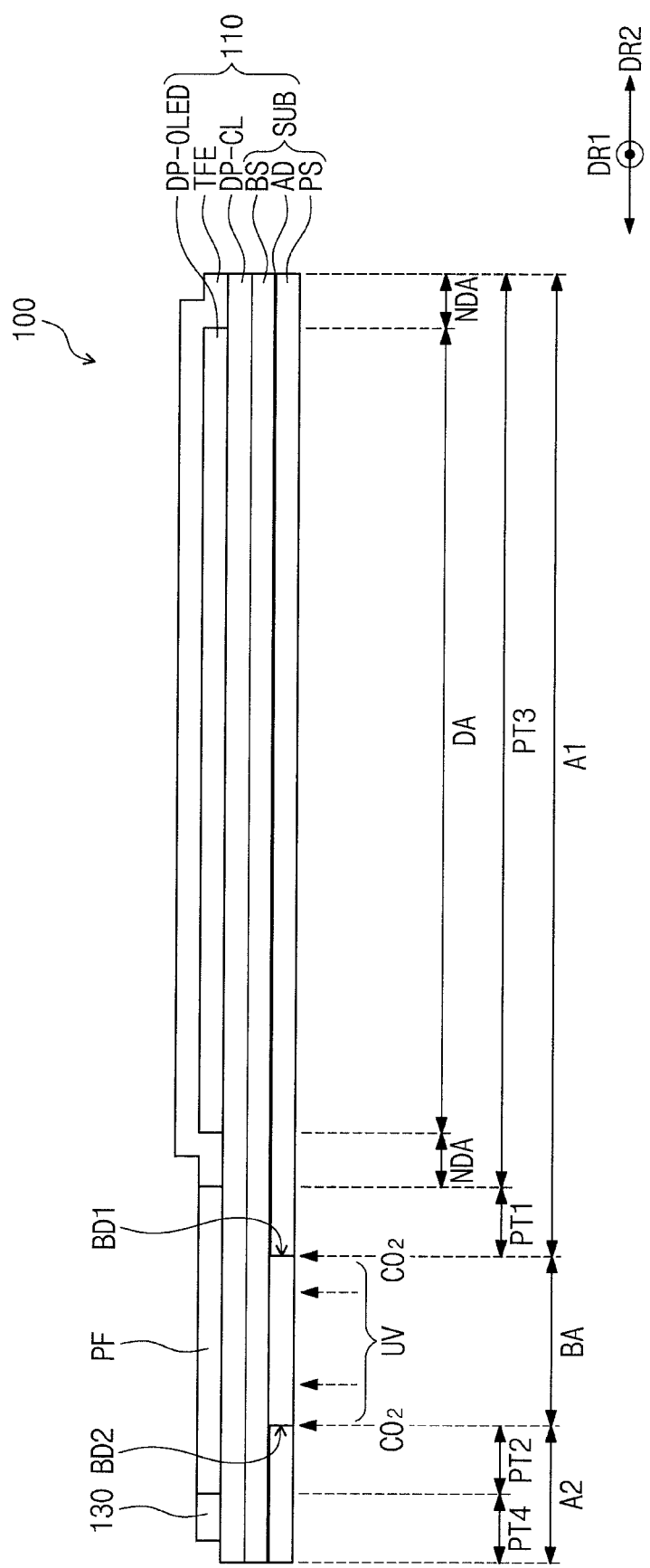
FIGS. 7 to 10 are schematic views illustrating a method of fabricating a display device, according to some embodiments of the invention.

Referring to FIG. 7, a display panel 110 may be prepared. The display panel 110 may be a display panel before the protective substrate PS of the bending area BA is removed. Laser may be irradiated into a bottom of the display panel 110 in the bending area BA. The laser may include a $CO_2$ laser and an ultraviolet (UV) laser. The UV laser may be irradiated into the bending area BA. The $CO_2$ laser may be irradiated into the protective substrate PS of a first boundary BD1 between the bending area BA and the first area A1, and to the protective substrate PS of a second boundary BD2 between the bending area BA and the second area A2.

Figure 8:
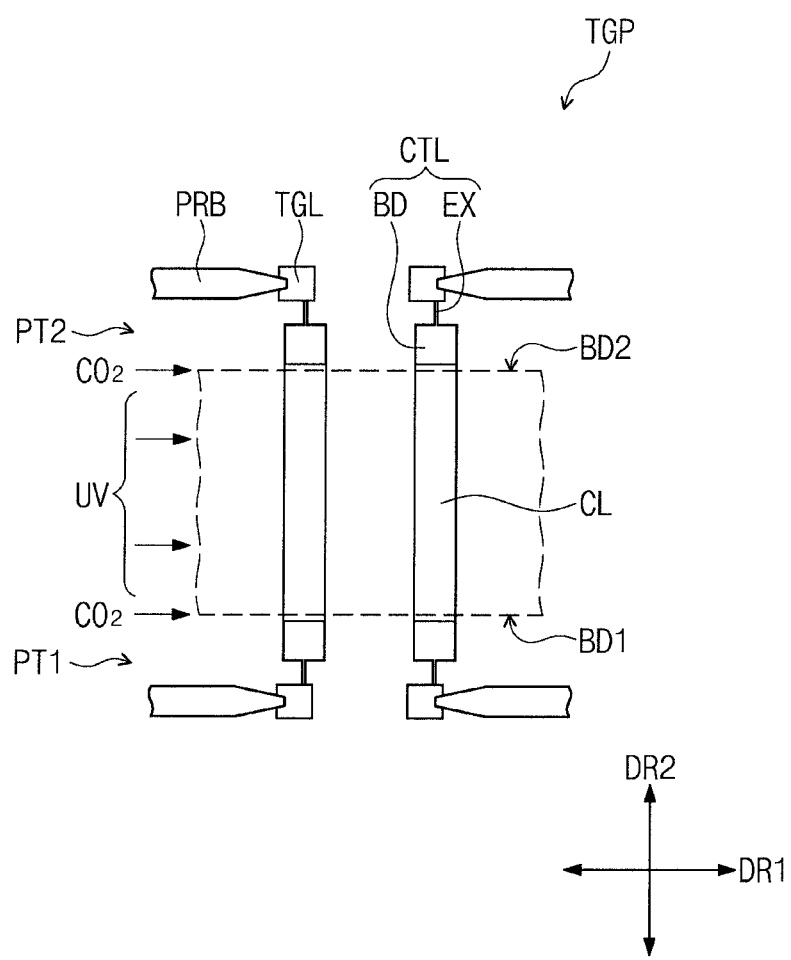

Referring to FIG. 8, probes PRB for measuring a resistance may come in contact with the tag layers TGL. The UV laser may pass through the base substrate BS and may be irradiated into the conductive layers CL disposed in the bending area BA. When the UV laser is irradiated into the conductive layers CL, the resistance of the conductive layers CL may be changed. Here, the resistance of the conductive layers CL may decrease as an irradiation time of the UV laser increases. The probes PRB may be in contact with the tag layers TGL to measure the resistance (or a resistance value) of the conductive layers CL.

Figure 9:
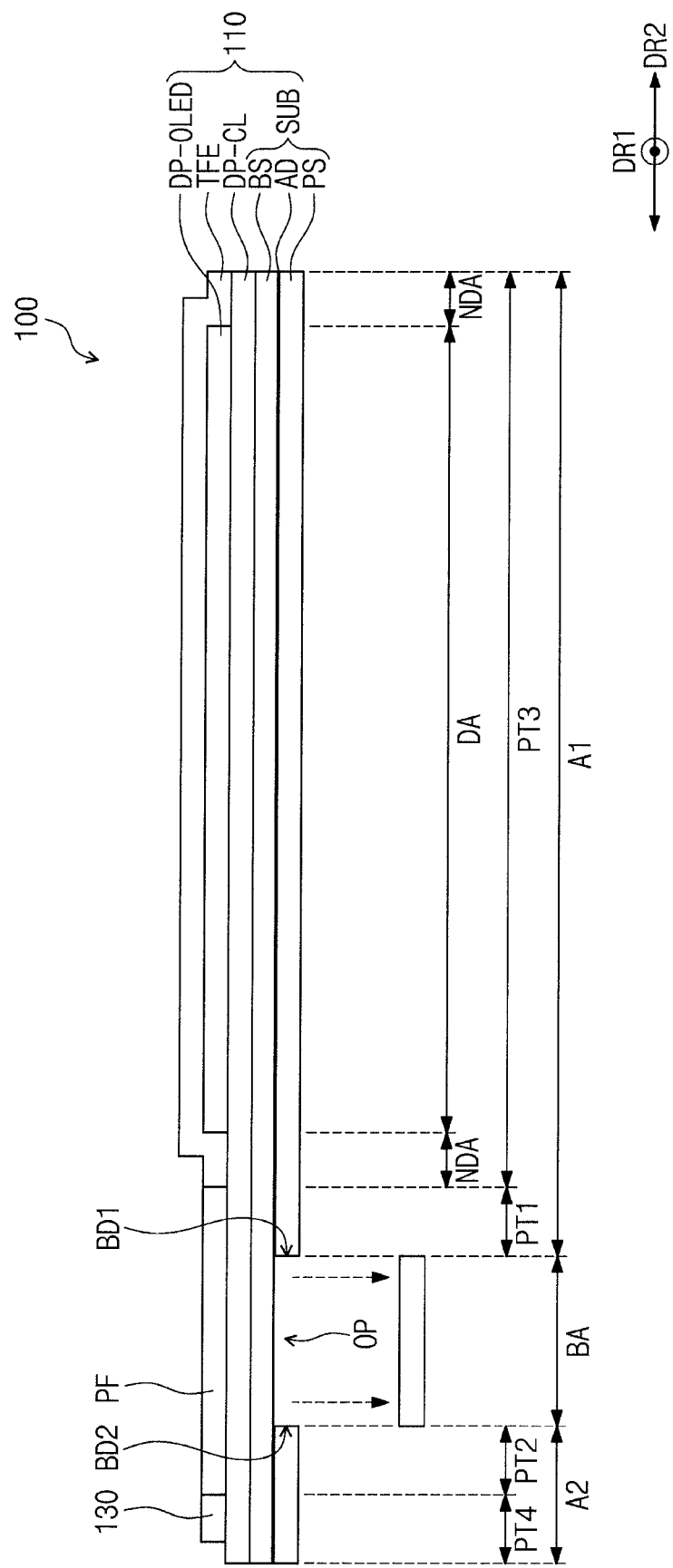

Referring to FIG. 9, the protective substrate PS of the first and second boundaries BD1 and BD2 may be cut by the $CO_2$ laser. For example, portions of the protective substrate PS disposed at the first and second boundaries BD1 and BD2 may be melted by the $CO_2$ laser and may thus be cut.

When the UV laser is irradiated into the bending area BA, adhesive strength between the base substrate BS and the adhesive member AD may be weakened by the UV laser. For example, when the UV laser is irradiated into the base substrate BS formed of polyimide, hydrogen may be generated from the base substrate BS to reduce or weaken the adhesive strength between the base substrate BS and the adhesive member AD. Thus, the base substrate BS and the adhesive member AD may be separated from each other in the bending area BA.

Since the base substrate BS and the adhesive member AD are separated from each other in the bending area BA and the portions of the protective substrate PS of the first and second boundaries BD1 and BD2 are cut, the protective substrate PS of the bending area BA may be easily separated from the base substrate BS. The protective substrate PS of the bending area BA may be removed by the UV laser and the $CO_2$ laser, and thus the opening OP may be defined or formed.

Referring to FIG. 10, since the protective substrate PS of the bending area BA is removed, a thickness of the display device 100 in the bending area BA may be reduced. Thus, the bending area BA may be easily bent. The bending area BA may be bent toward the bottom surface of the display panel 110, and the second area A2 in which the data driver 130 is disposed may be disposed under the first area A1 of the display panel 110. Since the second area A2 is disposed under the first area A1, the bezel area of the display panel 110 may be reduced or minimized.

If the UV laser is excessively irradiated into the base substrate BS of the bending area BA for a time greater than a reference time, the adhesive member AD may be carbonized. In this case, particles of the carbonized adhesive member AD may act as contaminant particles and may be adsorbed on or in the display panel 110 and cause a defective display panel. In other words, a yield of display panels may be reduced by the particles of the carbonized adhesive member AD.

However, according to the embodiments of the invention, the resistance of the conductive layers CL to which the UV laser is irradiated may be measured, and the irradiation time of the UV laser may be checked using the measured resistance of the conductive layers CL. When the resistance (value) of the conductive layers CL is equal to or less than a reference resistance value, the irradiation of the UV laser may be stopped. The reference resistance value may be set to a resistance value corresponding to an irradiation time of the UV laser before the adhesive member AD is carbonized.

Since the irradiation time of the UV laser is checked by measuring the resistance of the conductive layers CL, the irradiation of the UV laser may be stopped before the adhesive member AD is carbonized. Thus, it is possible to prevent the adhesive member AD from being carbonized by excessive irradiation of the UV laser. As a result, the yield of the display panel 110 may be improved when the display panel 110 is fabricated.

Figure 11:
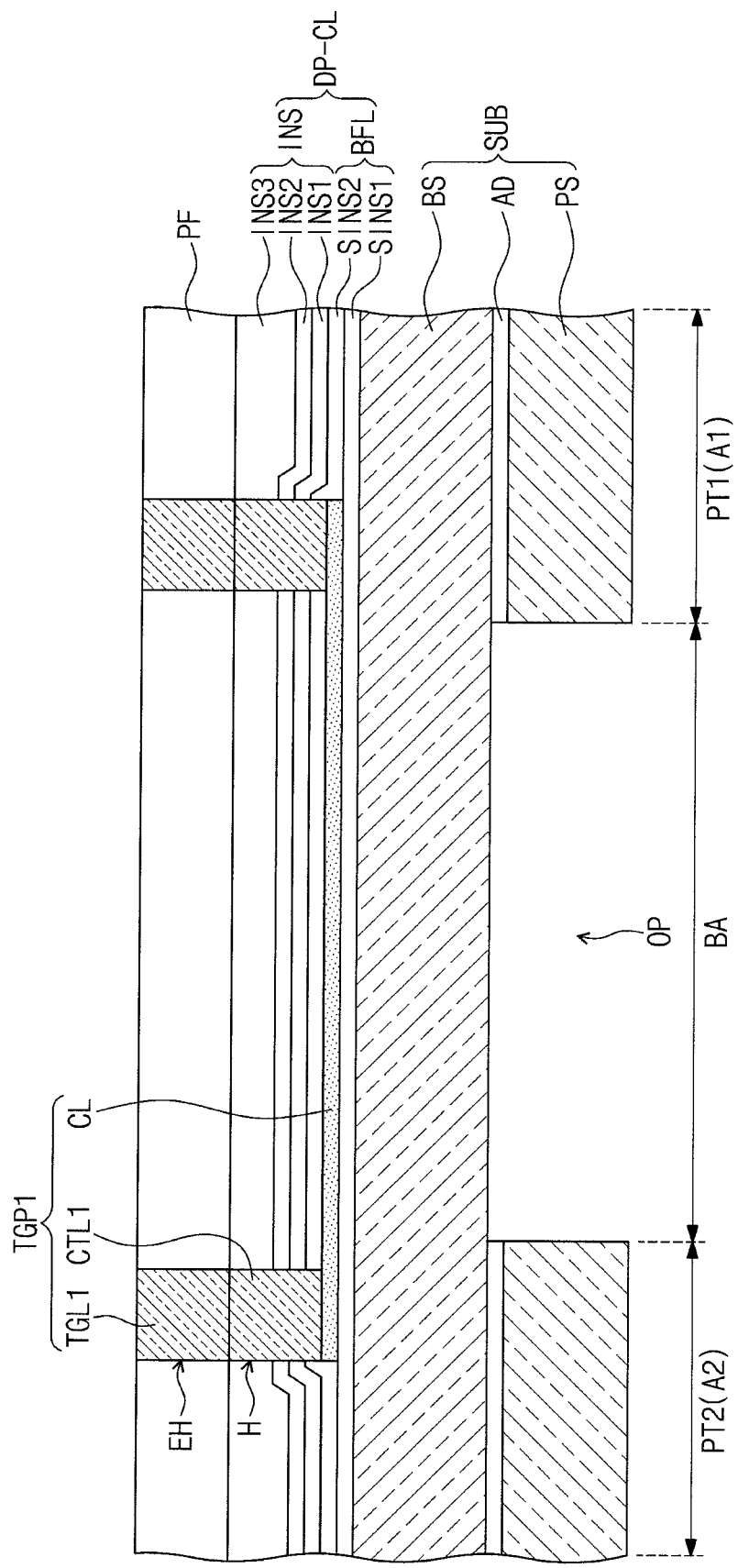
FIGS. 11 to 13 are schematic views illustrating tag portions of display devices according to some embodiments of the invention.
Figure 12:
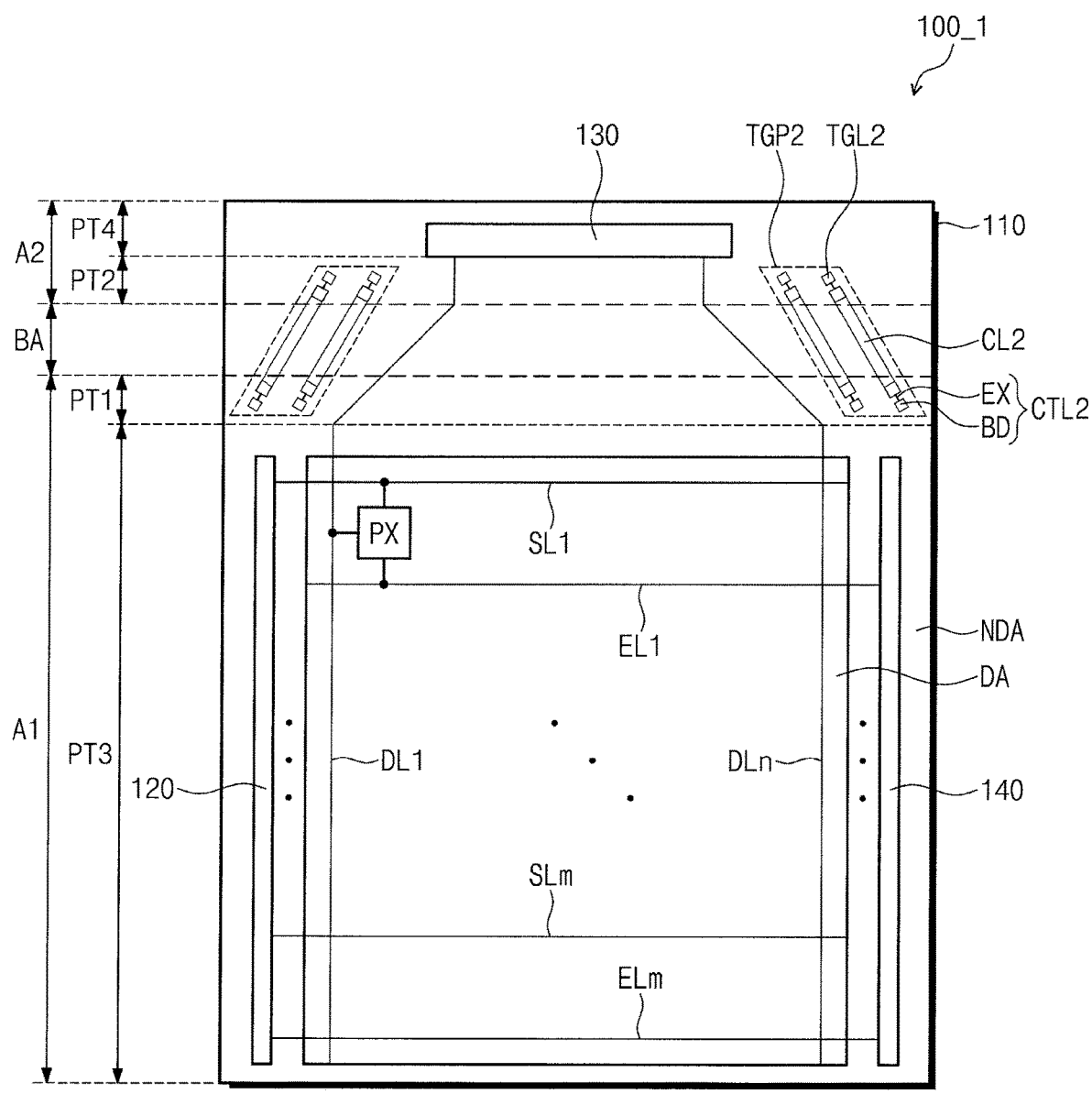
Figure 13:
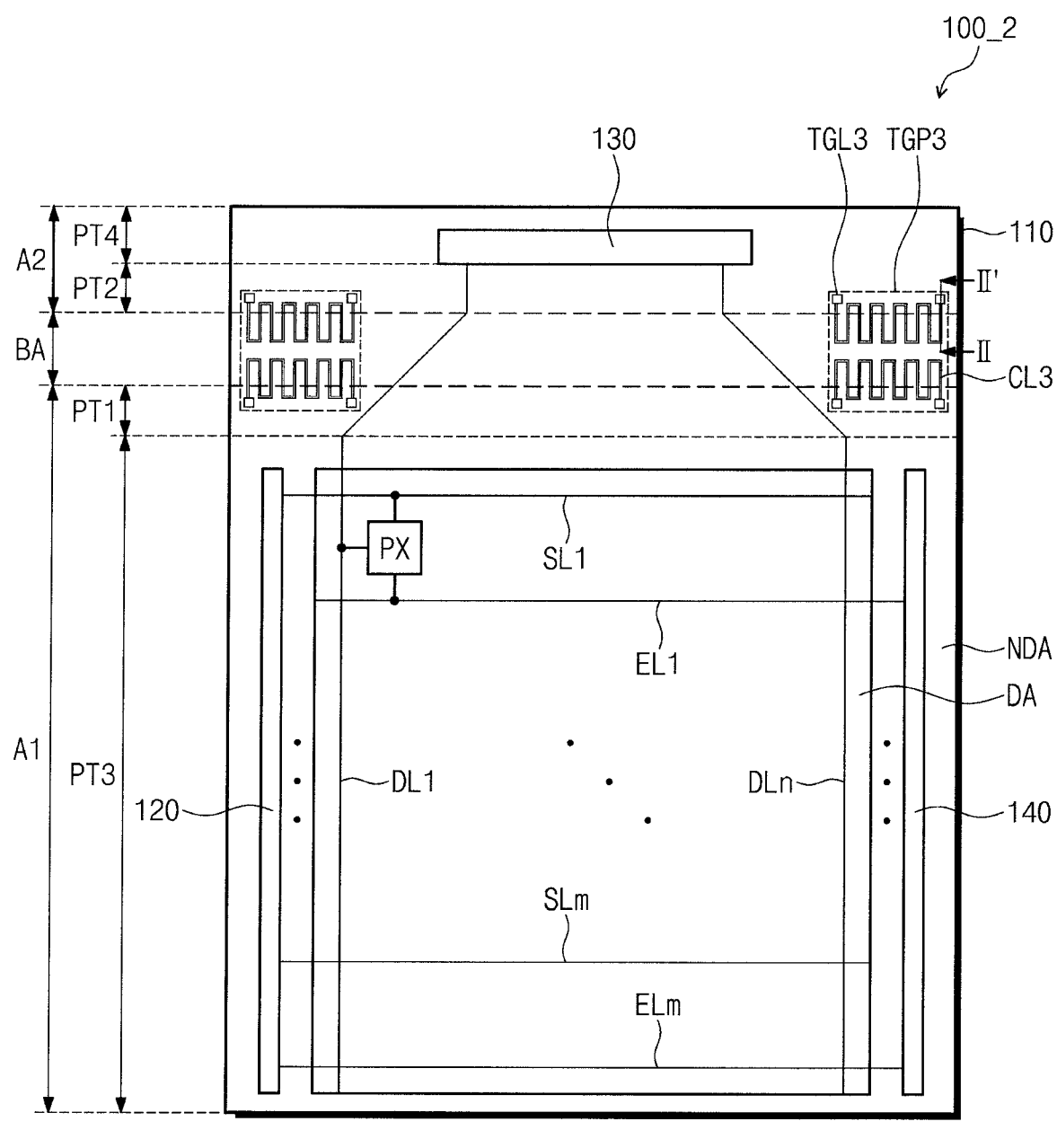
Figure 14:
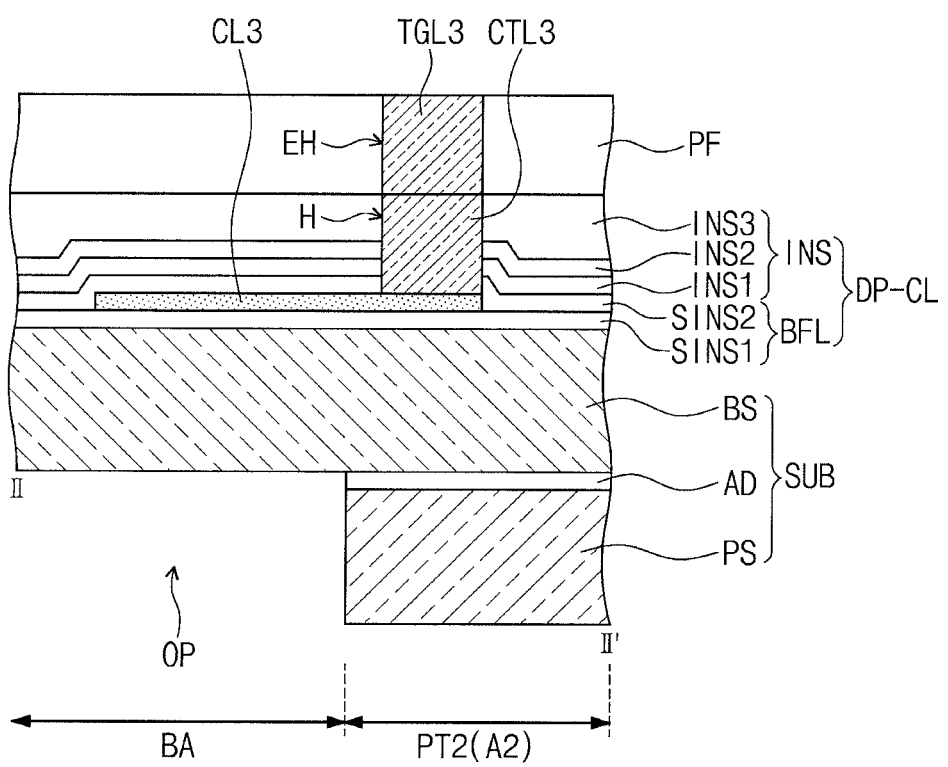
FIG. 14 is a cross-sectional view taken along a line II-II' of FIG. 13.

FIGS. 11 to 13 are schematic views illustrating tag portions of display devices according to some embodiments of the invention. FIG. 14 is a cross-sectional view taken along a line II-II' of FIG. 13.

Hereinafter, differences between tag portions TGP1, TGP2 and TGP3 of FIGS. 11 to 13 and the tag portion TGP of FIGS. 1, 2 and 5 will be mainly described for the purpose of ease and convenience in description. Except for the tag portions TGP1, TGP2 and TGP3, the other components of display devices 100_1 and 100_2 according to the embodiments of FIGS. 11 to 13 may be substantially the same as the corresponding components of the display device 100 illustrated in FIG. 1. Hereinafter, the same components in the embodiments of FIGS. 11 to 13 as in the embodiment of FIG. 1 will be indicated by the same reference designators.

Referring to FIG. 11, contact layers CTL1 of a tag portion TGP1 may be disposed on both ends of the conductive layer CL through the holes H penetrating the insulating layer INS and the second sub-insulating layer SINS2 and may be electrically connected to both ends of the conductive layer CL. The contact layers CTL1 do not include the extensions EX, unlike the contact layers CTL illustrated in FIG. 5.

Tag layers TGL1 may be exposed to the outside through exposure holes EH defined in the protective film PF. The tag layers TGL1 may be disposed on the contact layers CTL1 through the exposure holes EH and may be electrically connected to the contact layers CTL1. When a display device is fabricated, probes PRB may come in contact with the tag layers TGL1 to measure the resistance of the conductive layer CL. An interface exists between the contact layer CTL1 and the tag layer TGL1 in FIG. 11. However, embodiments of the invention are not limited thereto or thereby. In some embodiments, the contact layer CTL1 and the tag layer TGL1 may be formed of the same material and may constitute a single unitary body.

Referring to FIG. 12, conductive layers CL2 of tag portions TGP2 may extend in a direction forming a predetermined angle with the second direction DR2. The conductive layers CL2 may be electrically connected to tag layers TGL2 through contact layers CTL2. Except for the extending direction of the conductive layers CL2, a cross-sectional structure of the tag portion TGP2 may be substantially the same as the cross-sectional structure of the tag portion TGP illustrated in FIG. 5.

Referring to FIGS. 13 and 14, conductive layers CL3 of tag portions TGP3 may partially overlap with the bending area BA. The conductive layers CL3 may repeatedly intersect the first boundary BD1 and the second boundary BD2 and may extend in zigzag forms in the first direction DR1. Ends of the conductive layers CL3 may be disposed in the first portion PT1 and in the second portion PT2, respectively. Tag layers TGL3 may be respectively disposed in the first portion PT1 and the second portion PT2 so as to be electrically connected to the ends of the conductive layers CL3.

Contact layers CTL3 may be disposed on the ends of the conductive layers CL3 through holes H penetrating the insulating layer INS and the second sub-insulating layer SINS2. The contact layers CTL3 may be electrically connected to the ends of the conductive layers CL3. The tag layers TGL3 may be exposed to the outside through exposure holes EH defined in the protective film PF. The tag layers TGL3 may be disposed on the contact layers CTL3 through the exposure holes EH and may be electrically connected to the contact layers CTL3.

According to the embodiments of the invention, the conductive layer may be disposed on the base substrate of the bending area of the display panel, and the laser may be irradiated into the bending area to remove the portion of the protective substrate disposed under the base substrate in the bending area. When the laser is irradiated into the bending area, the resistance of the conductive layer disposed in the bending area may be changed depending on the irradiation time of the laser. Since the irradiation time of the laser is checked by measuring the resistance of the conductive layer, it is possible to prevent the adhesive member between the protective substrate and the base substrate from being carbonized. As a result, defects of the display panel caused by the carbonization of the adhesive member may be prevented.

Although example embodiments of the present invention have been described, it is understood that the present invention is not limited to these example embodiments, but various changes and modifications can be made by one of ordinary skill in the art within the spirit and scope of the present invention as hereinafter claimed. As would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Therefore, the disclosed subject matter is not to be limited to any single embodiment described herein, and the above-described embodiments are to be considered illustrative and not restrictive. Accordingly, the scope of the present invention shall be determined only according to the attached claims, and equivalents thereof.

What is claimed is:

1. A display device comprising:
    a substrate having a first area, a second area, and a bending area between the first and second areas;
    a plurality of pixels located above the substrate in the first area;
    a plurality of lines connected to the pixels, the lines comprising scan lines, data lines, and emission lines;
    a plurality of conductive layers extending to and intersecting the bending area;
    a protective film covering the conductive layers and located in the bending area, in a first portion of the first area adjacent to the bending area, and in a second portion of the second area adjacent to the bending area;
    a plurality of tag layers respectively located in the first and second portions and connected to both ends of the conductive layers; and
    a plurality of contact layers located between the conductive layers and the tag layers to be electrically connected to the conductive layers and the tag layers,
    wherein the bending area is interposed between the plurality of tag layers,
    wherein the tag layers are exposed to an outside of the display device by exposure holes defined in the protective film, and
    the conductive layers and the tag layers are electrically isolated from the lines.

2. The display device of claim 1, wherein the conductive layers comprise a semiconductor material.

3. The display device of claim 1, wherein the conductive layers comprise a metal material.

4. The display device of claim 1, wherein the tag layers and the contact layers comprise a conductive material.

5. The display device of claim 1, further comprising:
    a first sub-insulating layer located on the substrate, wherein the conductive layers are located on the first sub-insulating layer;
    a second sub-insulating layer located on the first sub-insulating layer to cover the conductive layers located on the first sub-insulating layer; and
    a third sub-insulating layer located on the second sub-insulating layer,
    wherein the protective film is located on the third sub-insulating layer in the bending area and in the first and second portions,
    wherein the tag layers are located on the third sub-insulating layer, and
    wherein the contact layers are located on both ends of the conductive layers through holes penetrating the second sub-insulating layer and the third sub-insulating layer and are electrically connected to both ends of the conductive layers.

6. The display device of claim 5, wherein the contact layers comprise:
    body portions located on both ends of the conductive layers through the holes so as to be electrically connected to both ends of the conductive layers; and
    extensions located on the third sub-insulating layer and extending from the body portions toward the tag layers so as to be electrically connected to the tag layers.

7. The display device of claim 6, wherein the tag layers are spaced from the body portions and are located on ends of the extensions so as to be electrically connected to the extensions.

8. The display device of claim 5, wherein the tag layers are located on the contact layers so as to be electrically connected to the contact layers.

9. The display device of claim 5, further comprising:
    an encapsulation layer located above the third sub-insulating layer to cover the pixels in a third portion of the first area which does not overlap the first portion,
    wherein the pixels comprise:
        a plurality of driving elements located on the second sub-insulating layer, wherein each of the driving elements comprises a gate electrode, a source electrode, and a drain electrode; and
        a plurality of light emitting elements located on the third sub-insulating layer and connected to the driving elements through contact holes defined in the third sub-insulating layer,
    wherein each of the light emitting elements comprises:
        a first electrode connected to a corresponding one of the drain electrodes;
        a second electrode facing the first electrode; and
        an organic light emitting layer located between the first electrode and the second electrode,
    wherein the contact layers are formed of the same material as the drain and source electrodes, and
    wherein the tag layers are formed of the same material as the drain and source electrodes or the first electrode.

10. The display device of claim 1, wherein the bending area extends in a first direction, and wherein the first area, the second area, and the bending area are arranged in a second direction intersecting the first direction.

11. The display device of claim 10, wherein the conductive layers extend in the second direction.

12. The display device of claim 10, wherein the conductive layers extend in a direction forming an angle with the second direction.

13. The display device of claim 10, further comprising:
    a scan driver located above the substrate in a third portion of the first area which does not overlap the first portion, and connected to the pixels through scan lines extending in the first direction;
    an emission driver located above the substrate in the third portion and connected to the pixels through emission lines extending in the first direction; and
    a data driver located above the substrate in a fourth portion of the second area which does not overlap the second portion, and connected to the pixels through data lines,
    wherein the data lines extend in the second direction in the second portion, extend radially in the bending area and in the first portion, and extend in the second direction in the third portion, wherein the conductive layers are located with the data lines interposed therebetween, and wherein the tag layers are located with the data lines interposed therebetween.

14. The display device of claim 13, wherein the substrate comprises:

a base substrate having flexibility;

a protective substrate located under the base substrate and having flexibility; and an adhesive member located between the base substrate and the protective substrate to adhere the base substrate to the protective substrate, wherein a bottom of the base substrate in the bending area is exposed through an opening defined by removing a portion of the protective substrate overlapping with the bending area.

15. The display device of claim 1, wherein the substrate has flexibility and the bending area is bent such that the second area is located under the first area.

* * * * *